United States Patent
Sukhman et al.

(10) Patent No.: US 6,423,925 B1
(45) Date of Patent: Jul. 23, 2002

(54) APPARATUS AND METHOD FOR COMBINING MULTIPLE LASER BEAMS IN LASER MATERIAL PROCESSING SYSTEMS

(75) Inventors: Yefim P. Sukhman; Christian J. Risser, both of Scottsdale; Edwin W. Gorham, Phoenix, all of AZ (US)

(73) Assignee: Universal Laser Systems, Inc., Scottsdale, AZ (US)

( * ) Notice: Subject to any disclaimer, the term of this patent is extended or adjusted under 35 U.S.C. 154(b) by 0 days.

(21) Appl. No.: 09/505,494

(22) Filed: Feb. 17, 2000

(51) Int. Cl.$^7$ .......................... B23K 26/00; B23K 26/14
(52) U.S. Cl. ........................ 219/121.6; 219/121.61; 219/121.67; 219/121.7; 219/121.76
(58) Field of Search ................ 219/121.6, 121.7, 219/121.8, 121.61, 121.67–121.72, 121.75, 121.76, 121.78

(56) References Cited

U.S. PATENT DOCUMENTS

| | | | |
|---|---|---|---|
| 3,772,519 A | | 11/1973 | Levey et al. |
| 4,174,150 A | | 11/1979 | Congleton |
| 4,293,827 A | | 10/1981 | McAllister et al. |
| 4,550,240 A | * | 10/1985 | Toida et al. .......... 219/121 LS |
| 4,652,721 A | * | 3/1987 | Miller et al. ............. 219/121.6 |
| 4,662,708 A | * | 5/1987 | Bagdal .................. 219/121.76 |
| 4,694,447 A | | 9/1987 | Cohen et al. |
| 4,821,113 A | | 4/1989 | McQuade et al. |
| 4,847,479 A | | 7/1989 | Clark et al. |
| 4,899,346 A | | 2/1990 | Perkins |
| 4,930,855 A | | 6/1990 | Clark et al. |
| 4,982,166 A | * | 1/1991 | Morrow ....................... 330/4.3 |
| 4,985,780 A | | 1/1991 | Garnier et al. .............. 229/303 |
| H933 H | * | 7/1991 | Buczek et al. .................. 356/5 |
| 5,057,100 A | * | 10/1991 | Lombardo ............. 219/121.74 |
| 5,081,637 A | | 1/1992 | Fan et al. |
| 5,127,731 A | | 7/1992 | Degroot |
| 5,168,454 A | * | 12/1992 | LaPlante et al. ........ 364/474.08 |
| 5,191,447 A | * | 3/1993 | Pinard ........................ 358/497 |
| 5,260,565 A | * | 11/1993 | Rose et al. ............. 250/227.15 |
| 5,319,528 A | * | 6/1994 | Raven .......................... 362/32 |
| 5,519,432 A | | 5/1996 | Genovese |
| 5,589,684 A | | 12/1996 | Ventrudo et al. |
| 5,611,946 A | * | 3/1997 | Leong et al. ............. 219/121.6 |
| 6,134,050 A | * | 10/2000 | Conemac .................... 359/618 |
| 6,014,206 A | | 11/2000 | Basting et al. |

OTHER PUBLICATIONS

Synrad Series 48 Lasers operation and service manual, release V2.0 Oct. 18, 1995, p. 15, Synrad, Inc., 11816 North Creek Parkway N., Bothell, WA 98011.
II–VI Incorporated optics catalog, pp. 17 and 18, Nov. 1995, II–VI Incorporated, 375 Saxonburg Blvd., Saxonburg, PA 16056.

* cited by examiner

Primary Examiner—Tom Dunn
Assistant Examiner—L. Edmondson
(74) Attorney, Agent, or Firm—Abelman, Frayne & Schwab

(57) ABSTRACT

Each one of multiple laser sources are independently separately mounted on a laser material processing platform and their beam paths are combined by a combiner which includes one or more optical elements mounted in the laser material processing platform which make the beam paths parallel and colinear. The combined beams are then moved in X and Y planes relative to a workpiece supported in the laser material processing platform under the control of a computer in the performance of work in accordance with a work program. The beam path of each laser source and the optical axis of the beam delivery system are each pre-aligned to the same predetermined reference and automatically coincide upon installation such that these components are rapidly and interchangeably interfaceable. The beams are orthogonally polarized and the optical elements of the combiner transmit one beam while reflecting another beam. While two laser beams are shown, an infinite number of laser beams may be used.

15 Claims, 3 Drawing Sheets

APPARATUS AND METHOD FOR COMBINING MULTIPLE LASER BEAMS IN LASER MATERIAL PROCESSING SYSTEMS

CROSS-REFERENCES TO RELATED APPLICATIONS

Not Applicable

STATEMENT REGARDING FEDERALLY SPONSORED RESEARCH AND DEVELOPMENT

Not Applicable

BACKGROUND OF THE INVENTION

1. Fields of the Invention

The present invention relates generally to apparatuses and methods of combining the multiple laser beams of multiple laser sources wherein the beam combiner is mounted in a laser material processing platform, and, more particularly, to combining pre-aligned multiple laser beams of multiple laser sources each of which is independently interfaced with a pre-aligned optical axis of a beam delivery system of the laser material processing platform.

2. Discussion of Background and Prior Art a. Widespread Applications And Rapid Growth Of Laser Material Processing Systems Mandated Interchangeability and Interfaceability of Laser System Components In our co-pending application entitled Method And Apparatus For Making Laser Sources and Laser Platforms Interchangeable and Interfaceable, which is hereby incorporated herein by reference, we described a pre-alignment apparatus and method in which each pre-aligned laser source of a line is interchangeable with any other laser source in the line similarly pre-aligned, each pre-aligned laser material processing platform in a line is interchangeable with any other laser material processing platform in the line similarly pre-aligned, and any such laser source is independently interfaceable with any such laser material processing platform, the respective beam paths and optical axes of any such laser source and any such laser material processing platform coinciding when any such laser source in the line is combined with any such laser material processing platform in the line to form a laser material processing system.

b. Prior Combined Beam Paths Of Multiple Laser Sources.

In an apparatus by Synrad, Inc. of Bothell Wash. 98011 a laser source Model 48-5-28 combines two standard, sealed off laser tubes to obtain twice the power of a single laser tube. The output beams from two 25 watt sealed off $CO_2$ tubes are combined optically to provide a single, diffraction-limited beam at 50 watts. Series 48 Lasers. Operation and Service Manual, Release v2.0, Synrad, Inc. (Oct. 18, 1995), p.15. All power and control functions between the two laser sections are totally independent, essentially achieving fail-safe operation for applications that can be served with the power of one laser. Any one electronic or laser tube failure will only affect that section, leaving the second channel unaffected and available for temporary use. The optical combining technique is based on the fact that each laser is linearly polarized, allowing the use of a polarization sensitive beam combiner to achieve 98% efficiency in combining the two beams. The two components of the resulting beam are spatially parallel and colinear. The normal temporal and spatial variations of a single laser are reduced by combining the output of two lasers. Output polarization is random. The 2-in-1 laser source is self-contained requiring only the application of power, cooling water, and a control signal.

There are several problems with the Synrad 2-in-1 concept:

1. If one tube fails, the whole dual laser assembly must be replaced.
2. There is no ability to reconfigure the laser system in the field to mix power levels of various laser sources to match a particular application.
3. The customer cannot buy just one laser source now and add another later.

Accordingly, it is an object of the present invention to provide a laser material processing platform into which one or more laser sources may be independently mounted to form a laser material processing system which can be rapidly reconfigured to match the specific power level requirements of any application.

c. Prior Independently Mounted Multiple Laser Sources With Combined Laser Beam Outputs In a prior apparatus and method by Morrow in U.S. Pat. No. 4,982,166 there is disclosed two independent lasers A and B mounted on a rigid base plate K upon which is also disposed a mixer box G. Adjustable optical element E is mounted in mixer box G presenting one of its optical surfaces at a Brewster angle relative to laser beam A and has a thin film polarizer coating on its other optical surface. Adjustable mirror H is also mounted in mixer box G and reflects 100% of laser beam B onto the coated surface of element E whereby 100% of beam A is transmitted by element E and substantially all of beam B is reflected by element E and the output is a common colinear beam with a power level that is approximately the sum of the power levels of the individual beams which is useful for medical treatment.

There are several problems with the Morrow apparatus.

1. There is no disclosure of beam combining optical elements separately mounted on a laser material processing platform with a beam delivery system with which the outputs of the dual lasers cooperate to do work on a workpiece, and because the beams may not be aligned well on the disclosed base plate even after installation and alignment, the patented structure seems limited in use to primarily manually articulated medical applications where small misalignments are not a major problem.
2. While Morrow's independent mounting on a base plate of the lasers allows him some flexibility in substituting lasers, nevertheless, as in Synrad's case, because the laser beams are not pre-aligned to a predetermined reference, Morrow's dual laser source structure cannot be rapidly reconfigured in the field to mix power levels of various laser sources to match a particular application without the need for a further alignment procedure.

Accordingly, it is an object of the present invention to provide a host laser material processing platform having a beam delivery system the optical axis of which is independently interfaced with the beam paths of multiple laser sources which are made colinear through a combiner mounted in the host laser material processing platform.

It is a further object of the present invention to enable a laser material processing system which can be controlled automatically by a computer program, and, in which, optionally, the laser beam paths and beam delivery system optical axis are each separately pre-aligned to a predetermined reference thereby making said components rapidly and interchangeably interfaceable.

BRIEF SUMMARY OF THE INVENTION

Set forth below is a brief summary of the invention which achieves the foregoing and other objects and provides the foregoing and hereafter stated benefits and advantages in accordance with the structure, function and results of the present invention as embodied and broadly described herein. Applicants' invention includes independently both the apparatus and the methods described herein which achieve the objects and benefits of the present invention. Both formats of the invention are described below, and it is applicants' intention to claim both formats even though from time to time below for purposes of clarity and brevity applicants will use either one or the other format to describe various aspects and features of the invention.

A first aspect of the invention is a laser material processing platform which includes a housing for supporting a workpiece on a work surface, a combiner having one or more optical elements mounted in the housing for making beams of multiple laser sources parallel and colinear, and a beam delivery system supported in the housing for directing the laser beam paths to the workpiece.

Further features of this aspect of the invention include a computer for controlling the performance of the work on the workpiece in response to a work program, the beam delivery system having an optical axis which has been pre-aligned to a predetermined reference, the combiner including an optical element having optical surfaces that are transmissive to one beam and reflective of another beam or an optical element having optical surfaces that are transmissive to a beam of one polarization state and reflective of a beam of another polarization state or an optical element oriented at a Brewster angle relative to a laser beam, and the combined laser beams movable in X-Y planes in the laser material processing platform relative to the workpiece supportable therein.

A second aspect of the invention is a method of making a laser material processing platform which includes the steps of mounting one or more optical elements on a housing for combining multiple laser beams to make the beam paths parallel and colinear, and mounting a beam delivery system in the housing for directing the combined laser beams to a workpiece supportable on a work surface therein for performing work thereon.

Further features of this aspect of the invention are the same as those set forth above as to the first aspect of the invention and are incorporated herein by reference.

A third aspect of the invention is a laser material processing system which includes a laser material processing platform for supporting a workpiece on a work surface, one or more laser sources supported in the laser material processing platform each providing a laser beam path, a beam delivery system having an optical axis supported in the laser material processing platform for directing the laser beam paths to the workpiece, and a combiner having one or more optical elements mounted on the laser material processing platform for making the beam paths parallel and colinear.

Further features of this aspect of the invention include the beam path of each laser source is independently interfaced with the optical axis of the beam delivery system, each laser source is independently supported on a separate mounting member on the laser material processing platform, each laser source is one in a line of which all are pre-aligned to a predetermined reference and the optical axis of the beam delivery system of the laser material processing platform is one in a line all of which are pre-aligned to the same predetermined reference as the laser sources so that the beam paths and optical axis automatically coincide upon mounting the laser sources on their respective mounting members, and each laser source is interchangeable with any laser source in the line.

Further features of this aspect of the invention are the same as those set forth above as to the first aspect of the invention and are incorporated herein by reference.

A fourth aspect of the invention is a method of making a laser material processing system which includes the steps of providing a laser beam path from each of one or more laser sources supported in a laser material processing platform, combining the laser beams through one or more optical elements mounted on the laser material processing platform to make the beam paths parallel and colinear, and directing the combined laser beams through a beam delivery system supported on the laser material processing platform for performing work on a workpiece supportable on a work surface therein.

Further features of this aspect of the invention are the same as those set forth above as to the first and third aspects of the invention and are incorporated herein by reference.

The advantages of the invention include the following:

1. Because the combiner optical elements are separately mounted on a laser material processing platform with a beam delivery system with which the outputs of the multiple lasers cooperate, the ability to use a laser to perform a broad spectrum of useful functions in a precision manner on a wide variety of materials is substantially enhanced.
2. Any laser system can be rapidly reconfigured in the field to mix power levels of various laser sources to match a particular application without the need for further alignment.
3. More efficient use of invested capital. Buy only the laser source you currently need and can afford and get an additional slot in the laser platform ready to receive the next laser source when it is needed as the business grows.
4. Substantially increased flexibility in customizing laser sources and laser material processing systems to match material processing requirements.
5. Add new laser sources to a line and satisfy multiple needs with one purchase.
6. Expanded utility of capital equipment without adding new equipment.
7. Optimized laser performance on the workpiece.
8. Reduced setup costs.
9. Decreased down time.
10. Enhanced productivity.
11. Increased profit-making opportunities.

BRIEF DESCRIPTION OF THE SEVERAL VIEWS DRAWINGS

DETAILED DESCRIPTION OF THE INVENTION

Figure 1:
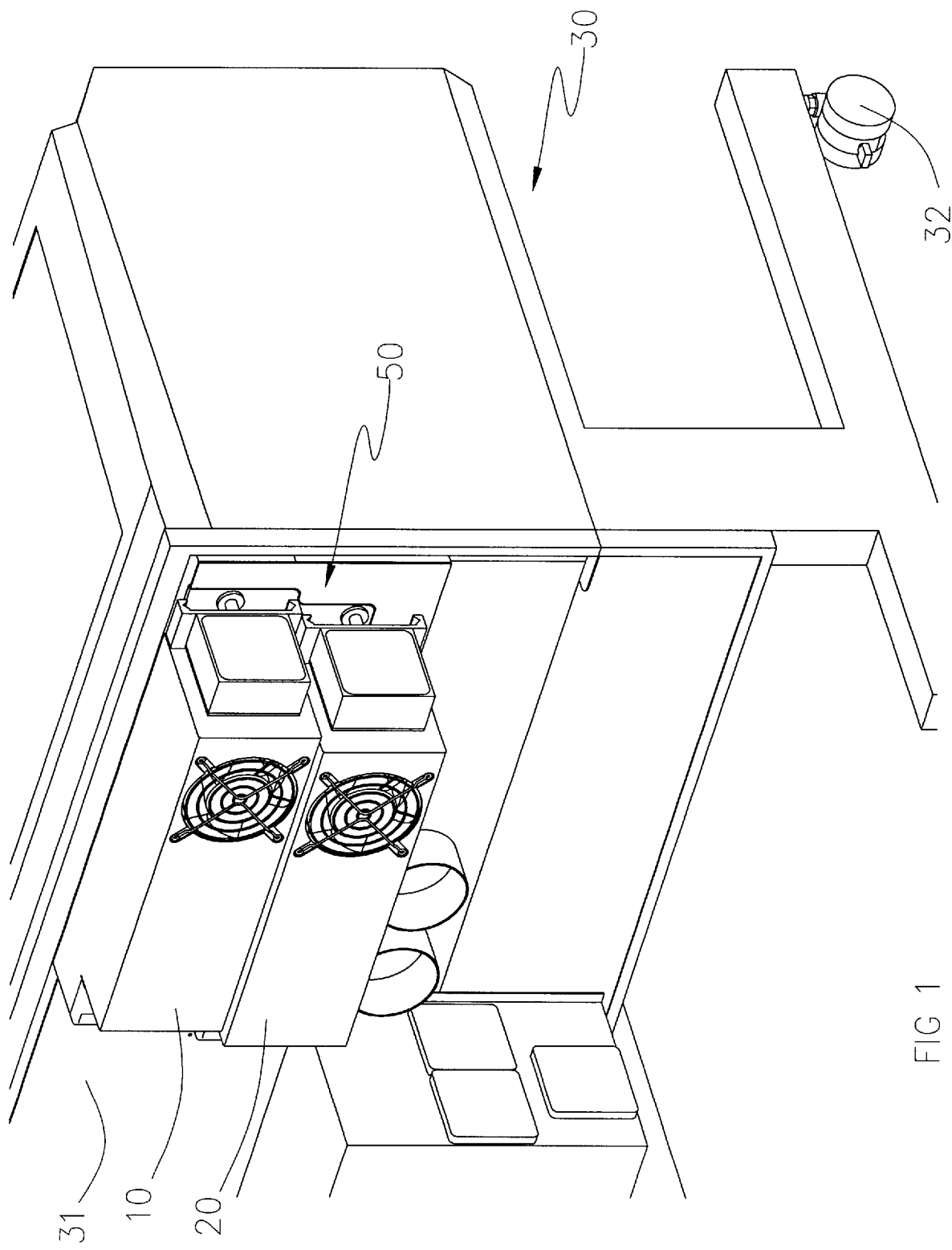
FIG. 1 is a partial perspective view of the back mounting plate of a laser material processing platform of the present invention supporting two laser sources of the present invention independently interfaced therewith. An infinite number of laser sources may be used.
Figure 2:
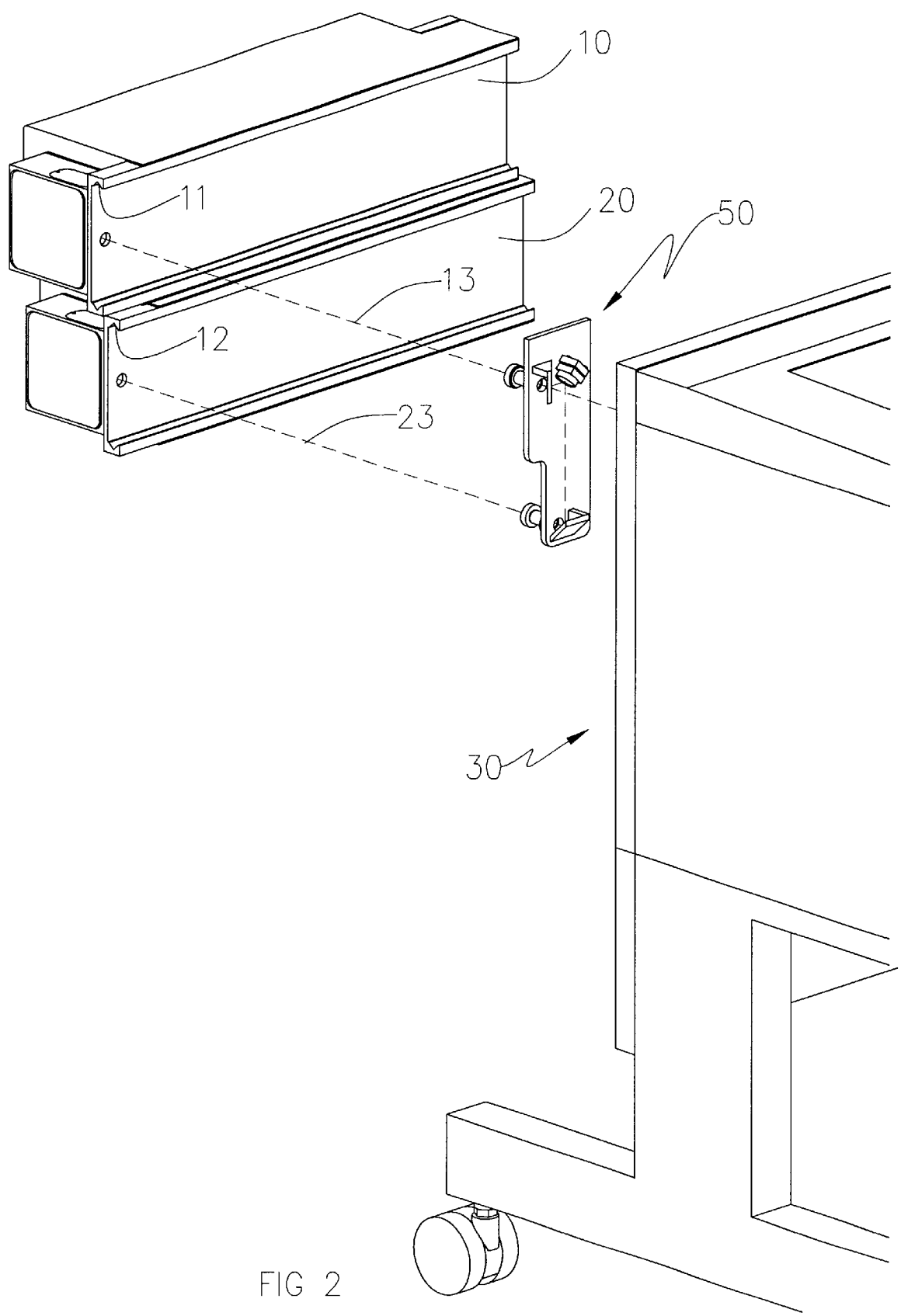
FIG. 2 is an exploded partial perspective view of FIG. 1 showing the combiner and its optical elements of the present invention.
Figure 3:
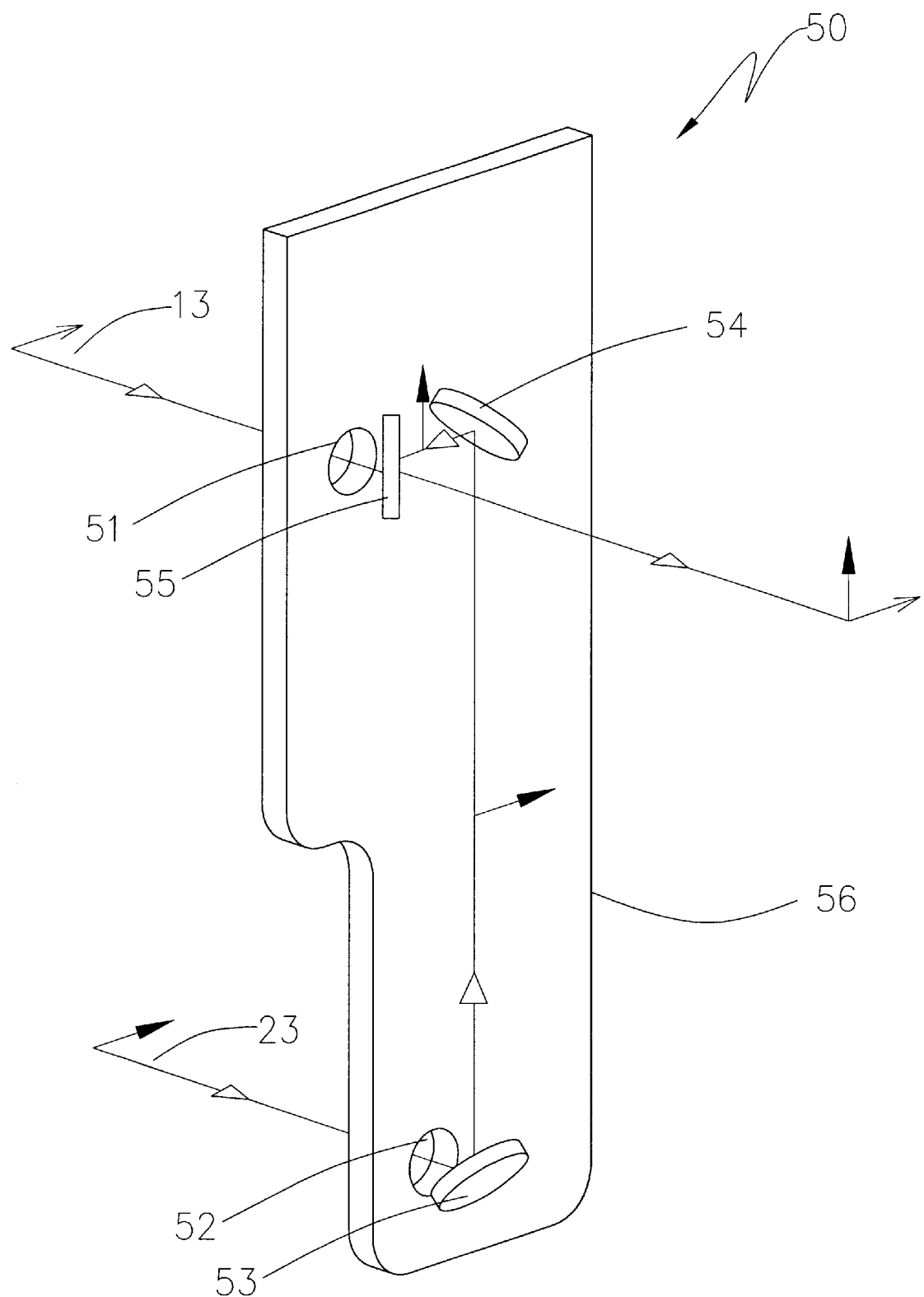
FIG. 3 is a perspective view of the combiner and its optical elements of FIG. 2.

In order to simplify the explanation of the present invention, the following discussion describes the present invention in terms of the two laser sources shown in FIGS. 1–3. However, those of ordinary skill in the art will understand from this disclosure that an infinite number of laser sources may be used in the configurations disclosed herein. Accordingly, it is the intention of the applicants that the scope of the invention be interpreted to include structures having such a plurality of laser sources.

As seen in FIGS. 1–3 two laser sources 10, 20 are each separately mounted on separate mounting members (not shown) affixed to the back mounting plate 31 of mobile 32 laser material processing platform 30 wherein downturned V-grooves 11,12 of laser sources 10, 20 respectively receive upturned ridges (not shown) of the mounting members (not shown)in accordance with the pre-alignment procedure taught in our co-pending application referenced above. Additionally, the beam paths 13, 23 of laser sources 10, 20 respectively have been pre-aligned to a reference also in accordance with the pre-alignment procedure taught in our same co-pending application referenced above. The optical axis of the beam delivery system of the laser material processing platform 30 has also been pre-aligned to the same reference in accordance with the pre-alignment procedure taught in our same co-pending application referenced above. Thus, the beam paths 13, 23 of the laser sources 10, 20 of the present invention coincide with (i.e., are colinear with) the optical axis of the beam delivery system (not shown) of the laser platform 30.

As seen in FIGS. 2, 3 the combiner 50 of the present invention is mounted in an opening in back mounting plate 31 of laser platform 30 and includes a plate 56 having an aperture 51 for passing beam path 13 of laser source 10, an aperture 52 for passing beam path 23 of laser source 20, and supporting a first 90° turning mirror 53 and a second 90° turning mirror 54 for reflecting beam path 23 onto one optical coated surface of optical element 55 supported on plate 56 while beam path 13 is directed onto the opposite surface of the optical element 55. The laser sources 10, 20 are mounted on their respective mounting members in staggered relation to each other such that one beam exits its source in a vertical plane perpendicular to its longitudinal axis spaced a predetermined axial distance from the vertical plane perpendicular to the longitudinal axis at which the other beam exits its source. The predetermined axial distance is seen in FIG. 3 as the horizontal spacing between the centers of apertures 51, 52. This horizontal spacing is necessary to accommodate the two 90° turning mirrors 53, 54 which are shown in this embodiment of the invention in order to rotate the polarization vector of the beam 23 relative to the beam 13, as is well known to those of ordinary skill in the art, so that the two beam paths 13, 23 can be made parallel and colinear by the combiner 50.

As best seen in FIG. 3, beam paths 13, 23 are both linearly polarized with the polarization vectors parallel to each other as they exit the laser sources 10, 20. Beam path 23 is directed through two reflections by mirrors 53 and 54 of combiner 50 which rotate the polarization vector through 90 degrees so that the polarization vector of beam 23 is perpendicular to the polarization vector of beam 13 when it contacts the coated surface of the optical element 55. The optical element 55 has been coated to reflect light polarized in a first direction while transmitting light polarized in a direction perpendicular to the first direction, as is well know to those of ordinary skill in the art. The optical element 55 is positioned so that beam path 13 passes through the one surface of the optical element 55 while the beam path 23 is reflected from the other surface of the optical element 55 which has been coated as described above. Beam combining can also be accomplished using uncoated optics positioned to use the Brewster angle, as is well known to those of ordinary skill in the art.

The beam paths 13, 23 exiting optical element 55 of combiner 50 are now combined and colinear. The power of the output beam is the approximate sum of the powers of the individual beams 13, 23. Because the beam paths 13, 23 and the optical axis of the beam delivery system of the laser material processing platform 30 have been pre-aligned as described above, the beam paths and optical axis coincide without any further alignment adjustment. The advantages outline above are now achievable.

The foregoing description of a preferred embodiment and best mode of the invention known to applicant at the time of filing the application has been presented for the purposes of illustration and description. It is not intended to be exhaustive or to limit the invention to the precise form disclosed, and obviously many modifications and variations are possible in the light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A laser material processing platform comprising:

a housing for supporting a workpiece;

a beam delivery system having an optical axis along which a working laser beam is deliverable to the workpiece;

a combiner mounted on said platform for combining plural laser beams incident thereon;

a first mounting member on said platform for mounting a first laser to produce a first laser beam, said first mounting member precisely aligning the first laser such that the first laser beam is incident on said combiner along a first predefined beam path; and a second mounting member on said platform for mounting a second laser to produce a second laser beam, said second mounting member precisely aligning the second laser such that the second laser beam is incident on said combiner along a second predefined beam path, wherein said combiner is constructed to combine any laser beam incident thereon along said first beam path with any laser beam incident thereon along said second beam path into a combined laser beam that is output from said combiner as the working laser beam along said optical axis, whereby the first and second laser beams are made collinear and incident on the workpiece without substantial adjustment of said combiner.

2. The platform of claim 1, wherein said combiner includes an optical element having optical surfaces that are transmissive to any laser beam received along said first beam path and reflective of any laser beam received along said second beam path.

3. The platform of claim 2, wherein said first mounting member is spaced from said second mounting member such that the first laser. beam as output from the first laser and the second laser beam as output from the second laser are separated, the first laser beam being incident on said optical element along said first beam path, said combiner further comprising a second optical element for deflecting the second laser beam onto the first mentioned optical element along said second beam path.

4. The platform of claim 3, wherein the first laser beam as output from the first laser and the second laser beam as output from the second laser are separated in both of two mutually perpendicular directions.

5. The platform of claim 4, wherein said second optical element includes a first mirror for reflecting the second laser beam at a right angle and a second mirror for reflecting the reflected second laser beam at another right angle to be incident on said first optical element.

6. The platform of claim 2, wherein the first laser beam as incident on said first optical element along said first beam path has a first polarization and the second laser beam as incident on said first optical element along said second beam path has a second polarization different from the first polarization, said first optical element being transmissive of light having the first polarization and reflective of light having the second polarization.

7. The platform of claim 1, wherein said combiner includes an optical element positioned at a Brewster angle relative to the second laser beam so as to combine the first and second laser beams.

8. A laser material processing system comprising:
    a processing platform, said platform comprising:
        a housing for supporting a workpiece;
        beam delivery system having an optical axis along which a working laser beam is deliverable to the workpiece; and
        a combiner mounted on said platform for combining plural laser beams incident thereon;
    a first laser for producing a first laser beam; and
    a second laser for producing a second laser beam;
    said processing platform further comprising:
        a first mounting member on said platform for mounting said first laser, said first mounting member precisely aligning said first laser such that said first laser beam is incident on said combiner along a first predefined beam path; and
        a second mounting member on said platform for mounting said second laser, said second mounting member precisely aligning said second laser such that said second laser beam is incident on said combiner along a second predefined beam path,
    wherein said combiner is constructed to combine any laser beam incident thereon along said first beam path with any laser beam incident thereon along said second beam path into a combined laser beam that is output from said combiner as said working laser beam along said optical axis,
    whereby said first and second laser beams are made collinear and incident on the workpiece without substantial adjustment of said combiner.

9. The system of claim 8, wherein said combiner includes an optical element having optical surfaces that are transmissive to any laser beam received along said first beam path and reflective of any laser beam received along said second beam path.

10. The system of claim 9, wherein said first mounting member is spaced from said second mounting member such that said first laser beam as output from said first laser and said second laser beam as output from said second laser are separated, said first laser beam being incident on said optical element along said first beam path, said combiner further comprising a second optical element for deflecting said second laser beam onto the first-mentioned optical element along said second beam path.

11. The system of claims 10, wherein said first laser beam as output from said first laser and said second laser beam as output from said second laser are separated in both of two mutually perpendicular directions.

12. he system of claim 11, wherein said second optical element includes a first mirror for reflecting said second laser beam at a right angle and a second mirror for reflecting said reflected second laser beam at another right angle to be incident on said first optical element.

13. The platform of claim 9, wherein said first laser beam as incident on said first optical element along said first beam path has a first polarization and said second laser beam as incident on said first optical element along said second beam path has a second polarization different from said first polarization, said first optical element being transmissive of light having said first polarization and reflective of light having said second polarization.

14. The system of claim 8, wherein said combiner includes an optical element positioned at a Brewster angle relative to said second laser beam so as to combine said first and second laser beams.

15. The platform of claim 8, further comprising a computer for controlling work done on the workpiece by said working laser beam in accordance with a work program.

* * * * *